(12) United States Patent
Lee

(10) Patent No.: US 7,590,020 B2
(45) Date of Patent: Sep. 15, 2009

(54) SEMICONDUCTOR MEMORY, SEMICONDUCTOR MEMORY SYSTEM AND METHOD OF MONITORING DYNAMIC TEMPERATURE THEREOF

(75) Inventor: Kee-Hoon Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 820 days.

(21) Appl. No.: 11/302,439

(22) Filed: Dec. 14, 2005

(65) Prior Publication Data

US 2006/0146629 A1 Jul. 6, 2006

(30) Foreign Application Priority Data

Dec. 17, 2004 (KR) .............................. 2004-107905

(51) Int. Cl.
*G11C 11/34* (2006.01)
(52) U.S. Cl. .................... 365/212; 365/51; 365/189.04; 365/233.13
(58) Field of Classification Search .................. 365/51, 365/52, 211, 189.04, 222, 191, 212, 233.13
See application file for complete search history.

(56) References Cited

U.S. PATENT DOCUMENTS

| | | | |
|---|---|---|---|
| 5,875,142 A | 2/1999 | Chevalier | |
| 6,084,812 A * | 7/2000 | Joo | 365/222 |
| 6,438,057 B1 | 8/2002 | Ruckerbauer | |
| 6,502,161 B1 * | 12/2002 | Perego et al. | 711/5 |
| 7,116,600 B2 * | 10/2006 | Choi | 365/221 |
| 7,260,007 B2 * | 8/2007 | Jain et al. | 365/212 |
| 7,454,586 B2 * | 11/2008 | Shi et al. | 711/167 |
| 2004/0236877 A1 | 11/2004 | Burton | |
| 2005/0138267 A1 * | 6/2005 | Bains et al. | 711/100 |

FOREIGN PATENT DOCUMENTS

| | | |
|---|---|---|
| JP | 10-334698 | 12/1998 |
| KR | 10-0298432 | 5/2001 |

OTHER PUBLICATIONS

Translation of German Official Letter mailed May 29, 2007 in corresponding German Patent Application No. 10 2005 059 780.7-55.

\* cited by examiner

*Primary Examiner*—Tuan T Nguyen
*Assistant Examiner*—Alexander Sofocleous
(74) *Attorney, Agent, or Firm*—Harness, Dickey & Pierce, P.L.C.

(57) ABSTRACT

A memory hub control block may be configured to decode a command packet received from a host and determine whether the command packet has designated the memory hub. If the command packet does not designate the memory hub control block, the memory hub control block may transmit a temperature information request signal to at least one of a plurality of semiconductor memory devices coupled to the memory hub, and receive temperature information from one of the plurality of semiconductor memory devices.

25 Claims, 6 Drawing Sheets

FIG. 3

| DRAM CMDS | 23 DS2 | 22 DS1 | 21 DS0 | 20 | 19 | 18 | 17 RS | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|---|
| | DST | | | CMD | | | RS | ADDR | | | | | | | | | | | | | | | | |
| ACTIVATE | DS2 | DS1 | DS0 | 1 | DRAM Addr | | RS | ROW ADDRESS | | | | | | | | | | | | | | | | |
| WRITE | DS2 | DS1 | DS0 | 0 | 1 | 1 | RS | | | | | | | | COLUMN ADDRESS | | | | | | | | | |
| READ | DS2 | DS1 | DS0 | 0 | 1 | 0 | RS | | | | | | | | COLUMN ADDRESS | | | | | | | | | |
| PRECHARGE ALL | DS2 | DS1 | DS0 | 0 | 0 | 1 | RS | x | x | x | x | 1 | 1 | 1 | x | x | x | x | x | x | x | x | x | x |
| PRECHARGE SINGLE | DS2 | DS1 | DS0 | 0 | 0 | 1 | RS | x | x | DRAM Bank | x | 1 | 1 | 0 | x | x | x | x | x | x | x | x | x | x |
| AUTO (CBR) REFRESH | DS2 | DS1 | DS0 | 0 | 0 | 1 | RS | x | x | x | x | 1 | 0 | 1 | x | x | x | x | x | x | x | x | x | x |
| ENTER SELF-REFRESH | DS2 | DS1 | DS0 | 0 | 0 | 1 | RS | x | x | x | x | 0 | 1 | 0 | x | x | x | x | x | x | x | x | x | x |
| EXIT SELF-REFRESH/ EXIT POWER DOWN | DS2 | DS1 | DS0 | 0 | 0 | 1 | RS | x | x | x | x | 0 | 0 | 1 | x | x | x | x | x | x | x | x | x | x |
| | DS2 | DS1 | DS0 | 0 | 0 | 1 | RS | x | x | x | x | 0 | 1 | 0 | x | x | x | x | x | x | x | x | x | x |
| | DS2 | DS1 | DS0 | 0 | 0 | 1 | RS | x | x | x | x | 0 | 0 | x | x | x | x | x | x | x | x | x | x | x |
| RESERVED | x | x | x | 0 | 0 | 0 | RS | x | x | x | x | x | x | x | x | x | x | x | x | x | x | x | x | x |

SEMICONDUCTOR MEMORY, SEMICONDUCTOR MEMORY SYSTEM AND METHOD OF MONITORING DYNAMIC TEMPERATURE THEREOF

CLAIM OF PRIORITY

A claim of priority is made under 35 U.S.C. 119 to Korean Patent Application No. 2004-107905 filed on Dec. 17, 2004 in the Korean Intellectual Property Office (KIPO), the entire contents of which are hereby incorporated by reference.

BACKGROUND OF THE INVENTION

1. Field of the Invention

Example embodiments of the present invention generally relate to a method of monitoring a dynamic temperature of a semiconductor memory system and a semiconductor memory system. More particularly, example embodiments of the present invention relate to a method of monitoring a dynamic temperature of a fully-buffered memory module, and the fully-buffered memory module.

2. Description of the Related Art

There are two reasons why dynamic temperatures of a Dynamic Random Access Memory (DRAM) device should be monitored.

The first reason is to reduce power consumption of the DRAM chip using a method similar to a temperature-compensated self-refresh (TCSR).

A memory cell of the DRAM chip records data by storing a charge in a cell capacitor. However, the charge in the cell capacitor may be lost over time due to a leakage current when no read/write operations take place. Hence, a refresh process configured to periodically rewrite data stored in the cell capacitor is needed. A refresh period may be defined as a time interval for refreshing the cell capacitor in the DRAM chip. The longer the refresh period is, the less a DRAM chip consumes power. Recently, manufactured DRAM chips have used Temperature-Compensated Self-Refresh (TCSR) to increase the self-refresh period. TCSR uses an embedded temperature sensor to measure an inner temperature of the DRAM chip and change the self-refresh period based on the measured temperature. The leakage current in the cell capacitor has a very strong dependency on temperature. Thus, when the temperature sensor detects a low temperature, a long refresh period may be maintained to reduce power consumption.

A second reason is that dynamic temperature monitoring may be necessary to determine an operating speed range, which may guarantee a reliability of the DRAM chip.

For example, when an inner temperature of the DRAM chip is above a specific threshold temperature, reliability of the DRAM chip may be guaranteed by decreasing the operation speed of the DRAM chip at the temperature.

Here, a temperature sensor may be used for the purpose of reducing the power consumption. It may not be necessary to transmit the measured temperature information exterior to the DRAM chip, because the temperature sensor may only be used internally. Therefore, the temperature sensor may be integrated into the DRAM chip to directly measure the temperature of the DRAM chip. Because it may not be necessary to communicate temperature information to an exterior of the DRAM chip, communications-related compatibility problems may not exist on an operational side.

However, to guarantee the operational reliability of a DRAM chip, the measured temperature information should be externally monitored, and thus, there may be a need for an operational method capable of transmitting the temperature information to the exterior of the DRAM chip without interrupting basic operations of the DRAM, for example, read operation and/or write operation.

The bandwidth throttling method may be used to overcome the above problem. The bandwidth throttling method controls an operational bandwidth based on a relationship between the operational bandwidth and a temperature instead of directly measuring a temperature by using temperature sensors. The relationship is a function of a current of a semiconductor chip and a temperature characteristic of a semiconductor package.

The bandwidth throttling method has the advantage of being easy to use because it indirectly uses the temperature sensor. However, it may be difficult to adapt the bandwidth throttling method to all of the various memory access types of DRAM devices. That is, there may be a negative effect in that if the bandwidth throttling method is used to set a threshold bandwidth to low level, when lowering of the threshold bandwidth may not be required, a general performance level of the DRAM may decrease.

A DRAM memory module having a plurality of memory devices mounted on a printed circuit board (PCB) may be classified as either a Single In-line Memory Module (SIMM) or a Dual In-line Memory Module (DIMM). A DIMM is one of the most commonly used types of memory module, and may be further classified as either a Fully-Buffered Dual In-line Memory Module (FB-DIMM) or a Registered DIMM. Recently, practical application research for the FB-DIMM has increased in an effort to obtain a high-speed and high-capacity memory system. A memory system including the FB-DIMM may include a plurality of slots on a motherboard for FB-DIMM insertion.

FIG. 1 is a block diagram illustrating a conventional memory system including Fully-Buffered Dual In-line Memory Modules (FB-DIMMs).

Referring to FIG. 1, a FB-DIMM memory system 100 may include a host 110 and a plurality of FB-DIMMs (MM1, . . . , MMn, n may be a natural number) connected in a daisy chain. In general, up to eight (8) FB-DIMMs (MM1, . . . , MMn) may be connected in the daisy chain.

The host 110 may include a transmitter (STx) to transmit southbound (SB) packets to the plurality of FB-DIMMs (MM1, . . . , MMn), and a receiver (NRx) to receive northbound (NB) packets that may be transferred from the plurality of FB-DIMMs to the host 110.

The FB-DIMMs (MM1, . . . , MMn) may include a memory hub (120-1, . . . , 120-n) and a plurality of DRAM devices (M1, . . . , Mm, m may be a natural number). Each memory hub may include an SB packet transceiver (STx/SRx), an NB packet transceiver (NTx/NRx), and a memory hub control block 122. Although not shown in FIG. 1, each of the memory hubs (120-1, . . . , 120-n) may include a System Management Bus (SMBus) interface block, and may be connected with the host 110 through a SMBus. Therefore, the host 110 may control the memory hubs (120-1, . . . , 120-n) through the SMBus.

The SB packet receiver (SRx) may receive a high-speed SB packet transferred from the host 110 or from an adjacent FB-DIMM located in an opposite direction to that of the SB packet's transmission. In contrast, the SB packet transmitter (STx) may transmit the SB packet received at the SB packet receiver (SRx) to an adjacent FB-DIMM located in the same direction as that of the SB packet's transmission.

The memory hub control block 122 may decode the SB packet received at the SB packet receiver (SRx); may generate command and address information for the DRAM devices (M1, . . . , Mm); may write data and read data; may encode the read data into an NB packet; and may transmit the NB packet through the NB packet transmitter (NTx).

The NB packet receiver (NRx) may receive a high-speed NB packet transferred from an adjacent FB-DIMM located in an opposite direction of the NB packet's transmission. In contrast, the NB packet transmitter (NTx) may transmit the NB packet received at the NB packet receiver (NRx) to the host 110 or an adjacent FB-DIMM located in the same direction as the NB packet's transmission.

In addition, each memory hub (120-1, ..., 120-n) may include a memory interface block 124 to interface with the DRAM devices (M1, ..., Mm). A FB-DIMM memory system 100 may use a memory hub, for example, an Advanced Memory Buffer (AMB), to buffer input/output data of DRAM devices instead of using a direct connection between the DRAM devices and a memory controller. However, a FB-DIMM memory system does not have temperature monitoring capabilities.

SUMMARY OF THE INVENTION

In example embodiment of the present invention, a memory hub may include a memory hub control block configured to decode a command packet received from a host and determine whether the command packet has designated the memory hub, and if the command packet does not designate the memory hub control block for the operation, the memory hub control block configured to transmit a temperature information request to at least one of a plurality of semiconductor memory devices coupled to the memory hub, and configured to receive a temperature information from the at least one of the plurality of semiconductor memory devices.

In another example embodiment of the present invention, a fully-buffered memory module may include a plurality of semiconductor memory devices, each respectively configured with a temperature sensor embedded therein, and a memory hub configured to buffer a command packet received from a host, control the plurality of semiconductor memory device in response to the command packet, buffer an output signal received from the plurality of semiconductor memory devices, and transmit the buffered output signal to the host. The memory hub is configured to generate a temperature information request signal if the command packet received from the host does not designate the memory hub.

In an example embodiment of the present invention, A fully-buffered memory module system may include at least one memory module, and a host configured to connect to the at least one memory module; wherein the at least one memory module includes, a plurality of semiconductor memory devices, each respectively configured with a temperature sensor embedded therein, and a memory hub configured to buffer a command packet received from a host, control the plurality of semiconductor memory device in response to the command packet, buffer an output signal received from the plurality of semiconductor memory devices, and transmit the buffered output signal to the host. The memory hub is configured to generate a temperature information request signal if the command packet received from the host does not designate the memory hub.

In another example embodiment, a method of monitoring dynamic temperature of a semiconductor memory device may include receiving a command packet at a memory hub, determining whether the command packet designates the memory, transmitting a temperature information request signal to at least one semiconductor memory device if the command packet does not designate the memory hub, and receiving temperature information from the at least one semiconductor memory device.

BRIEF DESCRIPTION OF THE DRAWINGS

The above and other aspects of the present invention will become more apparent with the detailed description of example embodiments thereof with reference to the accompanying drawings, in which:

FIG. 3 is a table showing a command frame of a southbound (SB) packet.

DETAILED DESCRIPTION OF EXAMPLE EMBODIMENTS

Figure 1:
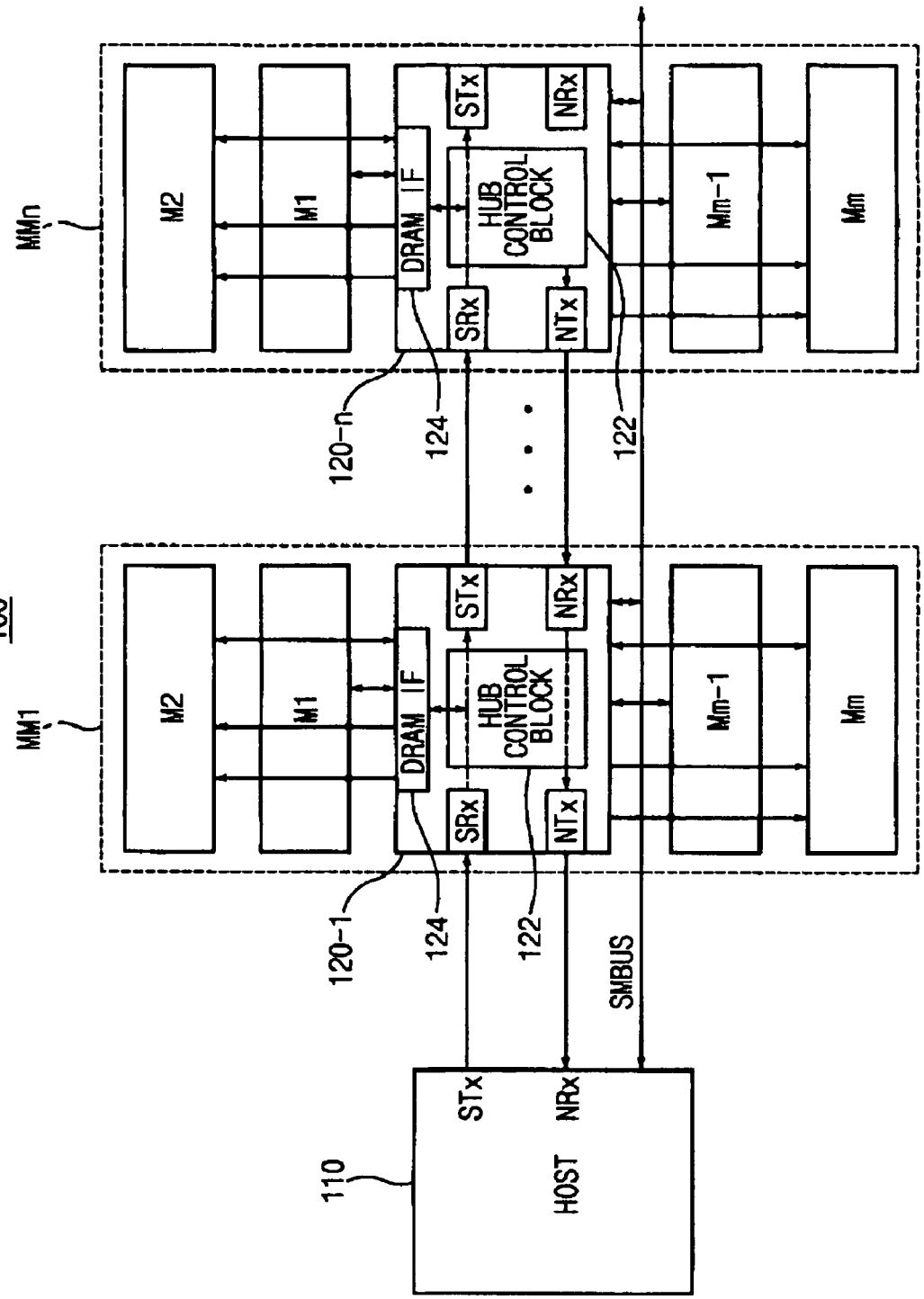
FIG. 1 is a block diagram illustrating a conventional memory system including Fully-Buffered Dual In-line Memory Modules (FB-DIMMs).

Detailed illustrative example embodiments of the present invention are disclosed herein. However, specific structural and functional details disclosed herein are merely representative for purposes of describing example embodiments of the present invention. This invention may, however, be embodied in many alternate forms and should not be construed as limited to the example embodiments set forth herein.

Accordingly, while the invention may be susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between", "adjacent" versus "directly adjacent", etc.).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises", "comprising, ", "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, for example, those defined in commonly used dictionaries, should be interpreted as having a meaning that is consistent with their meaning in the context of the relevant art and will not be interpreted in an idealized or overly formal sense unless expressly so defined herein.

It should also be noted that in some alternative implementations, the functions/acts noted in the blocks might occur out of the order noted in the flowcharts. For example, two blocks shown in succession may in fact be executed substantially concurrently or the blocks may sometimes be executed in the reverse order, depending upon the functionality/acts involved.

Example embodiments of the present invention may use command snooping to configure an FB-DIMM memory system having a capability of dynamic temperature monitoring without interrupting read/write operations.

Figure 2:
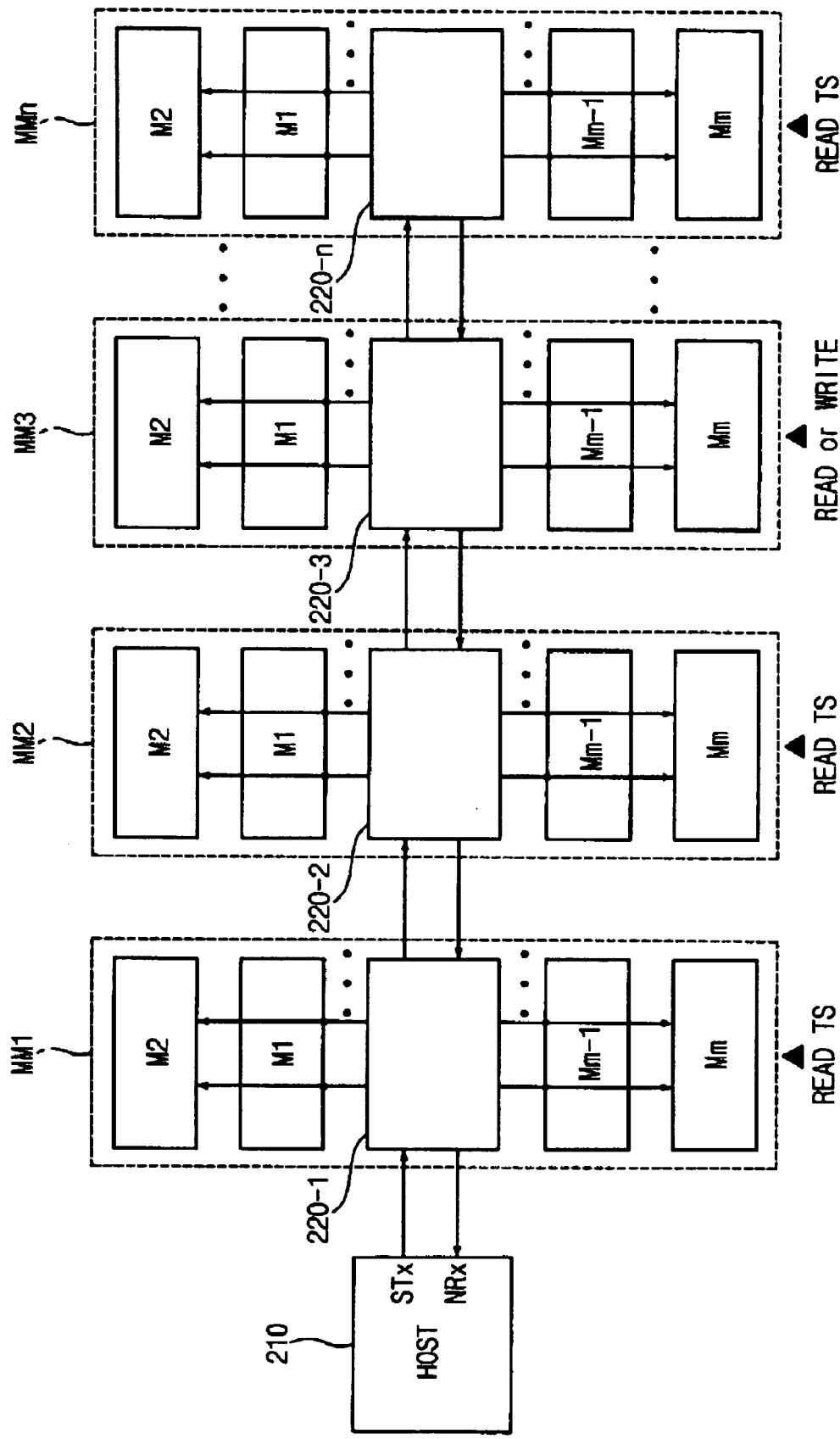
FIG. 2 is a block diagram illustrating a dynamic temperature monitoring operation of an FB-DIMM memory system according to an example embodiment of the present invention.

FIG. 2 is a block diagram of an FB-DIMM memory system including dynamic temperature monitoring according to an example embodiment of the present invention.

The FB-DIMM memory system may include a host 210 to control a plurality of FB-DIMMs (MM1, . . . , MMn). Each of the FB-DIMM (MM1, . . . , MMn) illustrated in FIG. 2 may include a plurality of DRAM devices (M1, . . . , Mm) and a memory hub (220-1, . . . , 220-n), respectively.

The host 210 may transmit an SB packet designating one of the plurality of FB-DIMMs, which may be a designated FB-DIMM during an access operation, for example, a read/write operation.

The designated FB-DIMM may determine whether a command address code of the SB packet transmitted by the host 210 is designated for itself, and if designated for itself, carries out the operation assigned by the SB packet. FIG. 2 illustrates a READ or WRITE command specifically designating a FB-DIMM (MM3) by the SB packet. However, it is understood that commands may be designated for any one of the plurality of FB-DIMMs.

Nondesignated FB-DIMMs, that is, FB-DIMMs that are not designated by a command address code of the SB packet, for example, FB-DIMM (MM 1, MM2, . . . , MMn), may read temperature information that may be measured by temperature sensors (e.g., read temperature sensors (TS)) embedded within DRAM devices by the respective FB-DIMM, while the designated FB-DIMM carries out the command operation designated in the SB packet.

A dynamic temperature monitoring method according to an example embodiment of the present invention may read temperature information without interrupting memory access operations of the designated FB-DIMM (MM3), because nondesignated FB-DIMMs (MM1, MM2, . . . , MMn) may read temperature information through respective memory hubs (220-1, 220-2, . . . , 220-n) included in each of the FB-DIMMs. It is well known in the art that a DRAM device may include embedded therein temperature sensors.

The SB packet may include ten (10) data streams and each of the data streams may have twelve (12) bits transmitted during a single memory operation clock period. Therefore, a single SB packet may include 120 bits of packet data in total, and the packet data may include three (3), each frames having 40 bits. That is, the three frames may include a single command frame, and first and second write data frames; or alternatively, a single command frame and two No Operation (NOP) frames. The command frame may include 16-bit Cyclic Redundancy Check (CRC) code, and 24-bit command information. The first write data frame may include memory data of an upper 36 bits and the second write data frame may include memory data of a lower 36 bits.

Figure 4:
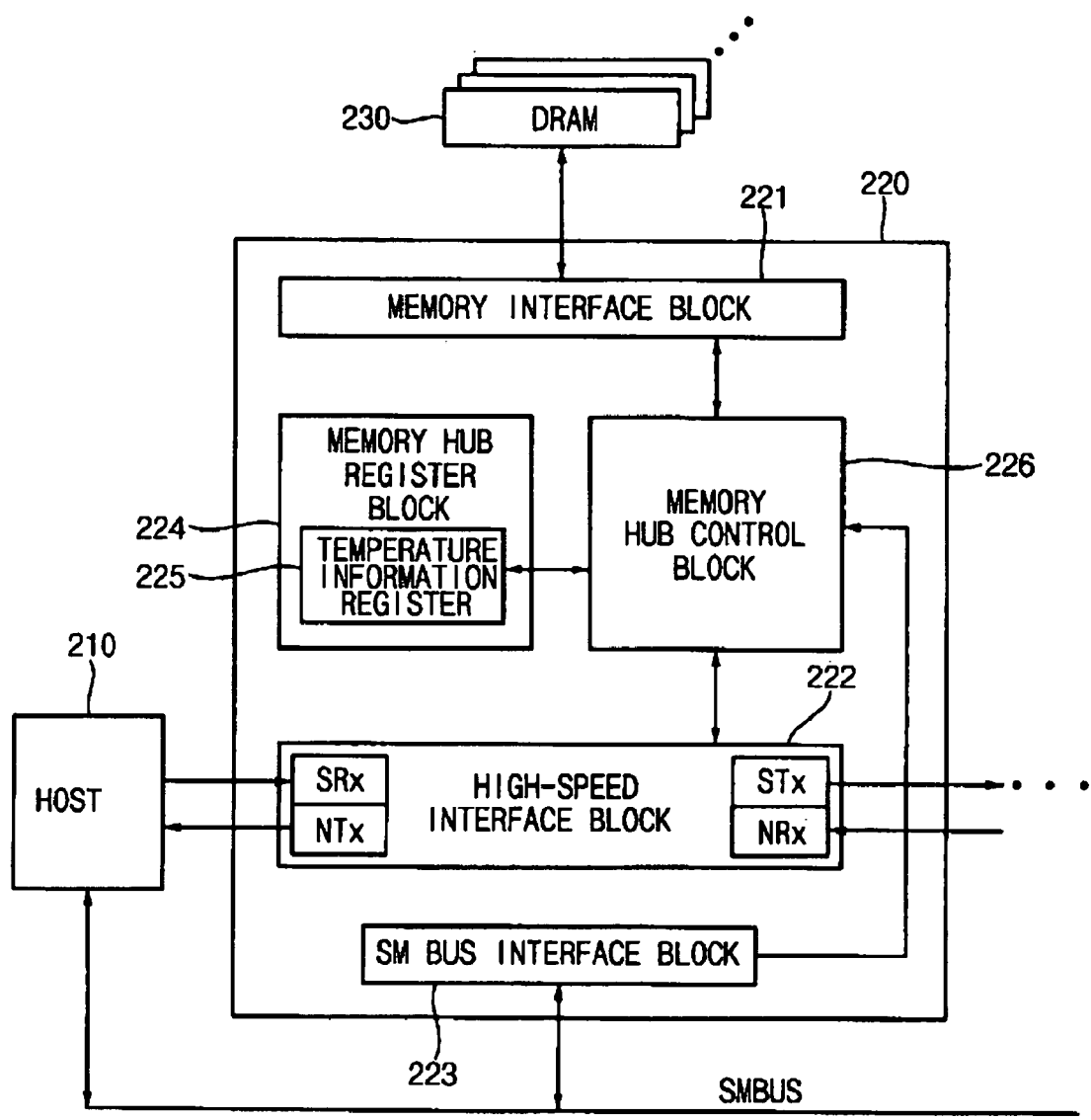
FIG. 4 is a block diagram illustrating an embodiment of an memory hub of the FB-DIMM memory system illustrated in FIG. 2.

A dynamic temperature monitoring may be performed based on an encoding of an SB packet command frame as illustrated in FIG. 3, and may be embodied as illustrated in FIG. 4.

FIG. 3 is a chart showing a command frame of a southbound (SB) packet.

The twenty four (24)-bit command information of a command frame of a SB packet may include 3-bit destination information (DST), 1-bit rank selection information (RS), a DRAM command (CMD), and an address (ADDR). The 3-bit destination information (DST) may be one of an 8-module identification codes, each of the codes may correspond to one of the eight FB-DIMMs (MM1, . . . , MM8), which may be connected to a single host. For example, "000" may represent the first FB-DIMM module, and "111" may represent the eighth FB-DIMM module. The rank selection bit (RS) may select one of the two sides of each FB-DIMM module.

The DRAM command (CMD) may be divided into two groups. A first group may include address information, for example, an ACTIVATE command, a WRITE command, and a READ command. A second group may include a PRECHARGE ALL command and a PRECHARGE SINGLE command, and may exclude the address information. In the case of the ACTIVATE command, a 21st bit of the command information (CMD) may be defined as "1", and a combination of other bits may correspond to DRAM bank address and row address values.

The WRITE command and READ command may be distinguished from each other by a combination of a 19th bit and a 20th bit of the command information (for example, "11" and "10", respectively), and a combination of other bits may correspond to a column address value.

In a FB-DIMM memory system, memory hubs 220 of all of FB-DIMM modules (MM1, . . . , MMn) connected with a host 210 in a daisy chain may receive an SB packet which may be transmitted by the host 21 0 for decoding. Therefore, each of the FB-DIMM modules (MM1, . . . , MMn) may have the capability of determining whether the SB packet has been designated for itself, and may recognize a type of command operation.

FIG. 4 is a block diagram illustrating an embodiment of a memory hub of the FB-DIMM memory system of FIG. 2.

Referring to FIG. 4, a memory hub 220 of a FB-DIMM memory system, to which dynamic temperature monitoring may be applied, according to an example embodiment of the present invention may include a memory interface block 221, a high-speed interface block 222, an SMBus interface block 223 to communicate with a host 210, a memory hub register block 224 including a temperature information register 225 having at least a single bit capacity, and a memory hub control block 226.

The memory interface block 221 may interface between DRAM devices 230 and the memory hub 220. That is, the memory interface block 221 may be connected (not shown) with an input/output pin, a control signal pin, and an address pin of the DRAM devices 230

The high-speed interface block 222 may include an SB packet transmitter (STx), an SB packet receiver (SRx), an NB packet transmitter (NTx), and an NB packet receiver (NRx). In general, the high-speed interface block 222 may communicate at high speeds with the host 210 and neighboring FB-DIMMs by Low-Voltage Differential Signaling (LVDS).

Each of the FB-DIMM (MM1, . . . , MMn) and the host 210 may be connected to each other by a System Management Bus (SMBus), so that the SMBus interface block 223 may communicate with the host 210.

The memory hub control block 226 may decode the SB packet that may be received from the host 210 through the high-speed interface block 222. Based on the command information of the decoded SB packet, the memory hub control block 226 may control the DRAM devices 230. In addition, the memory hub control block 226 may encode data received from the DRAM devices 230 into an NB packet, and transmit the NB packet to the host 210 through the high-speed interface block 222.

The memory hub control block 226 may determine whether the SB packet received through the high-speed interface block 222 has been designated for itself by analyzing the 3-bit destination information (DST) within the 24-bit command information.

If the memory hub control block 226 determines that the 3-bit destination information (DST) has been designated for itself, the memory hub control block 226 may carry out an operation, which may correspond to a DRAM command (CMD), for the DRAM devices 230 included in the designated FB-DIMM.

On the contrary, if the memory hub control block 226 determines that the 3-bit destination information (DST) has not been designated for itself, the memory hub control block 226 may request temperature information of the DRAM devices 230 through the DRAM interface block 221.

A separate temperature information input/output pin or an existing input/output pin may be allocated in order to request or to receive the temperature information. If an existing input/output pin is used, it may have no effect on operations of the FB-DIMM module carrying out the command operation.

The memory hub control block 226 may receive and store the temperature information in the temperature information register 225. The temperature information register 225 may be included in the memory hub register block (224).

The temperature information register 225 may have a single bit capacity wherein the bit maybe an alert flag to indicate whether the measured temperature is above a threshold temperature. For example, when an inner temperature of the DRAM chip is above a specific threshold temperature, reliability of the DRAM chip may be guaranteed by decreasing the operation speed of the DRAM chip at the temperature. In addition, the temperature information register 225 may have a plurality of bits, so that the temperature information register may directly monitor the temperature values of the DRAM devices 230. The configuration of the temperature information register 225 may depend on a type of temperature information of the DRAM devices 230.

The host 210 may read the temperature information from at a temperature information period of the temperature information register 225 through the SMBus and SMBus interface block 223 at a predefined temperature information period of. The temperature information of the DRAM devices 230 may be transferred to the host 210 through the SMBus instead of being transferred to the host 210 as a separate NB packet, thereby normal read/write operations may not be interrupted and system performance may not deteriorate.

The temperature information period may be varied according to a required temperature monitoring period. For example, the period may be expressed in microseconds $[10^{-6}$ s] or milliseconds $[10^{-3}$ s].

If a destination information (DST) in command information of an SB packet received by a memory hub control block 226 is not designated for itself, the memory hub control block 226 may read temperature information of the DRAM devices 230 when a DRAM command (CMD) code corresponds to a READ command, or alternatively when a DRAM command (CMD) code corresponds to a READ command or a WRITE command.

For example, in the command frame illustrated in FIG. 3, only when the DRAM command (CMD) represents the READ command, the memory hub control block 226 may read the temperature information of the DRAM devices 230. Alternatively, if the DRAM command (CMD) is a READ or WRITE command, the memory hub control block 226 may read the temperature information of the DRAM devices 230.

The gathering process of temperature information of the DRAM devices 230 by the memory hub control block 226 as described above may vary depending on a memory system configuration. That is, if the memory hub control block 226 frequently reads the temperature information from the DRAM devices 230, the accuracy of the temperature information of the DRAM devices 230 may improve, but the electrical current consumption of the memory module may increase. On the other hand, if the memory hub control block 226 infrequently reads the temperature information from the DRAM devices 230, the accuracy of the temperature information of the DRAM devices 230 may decrease, but the current consumption of the memory module may decrease.

Figure 5A:
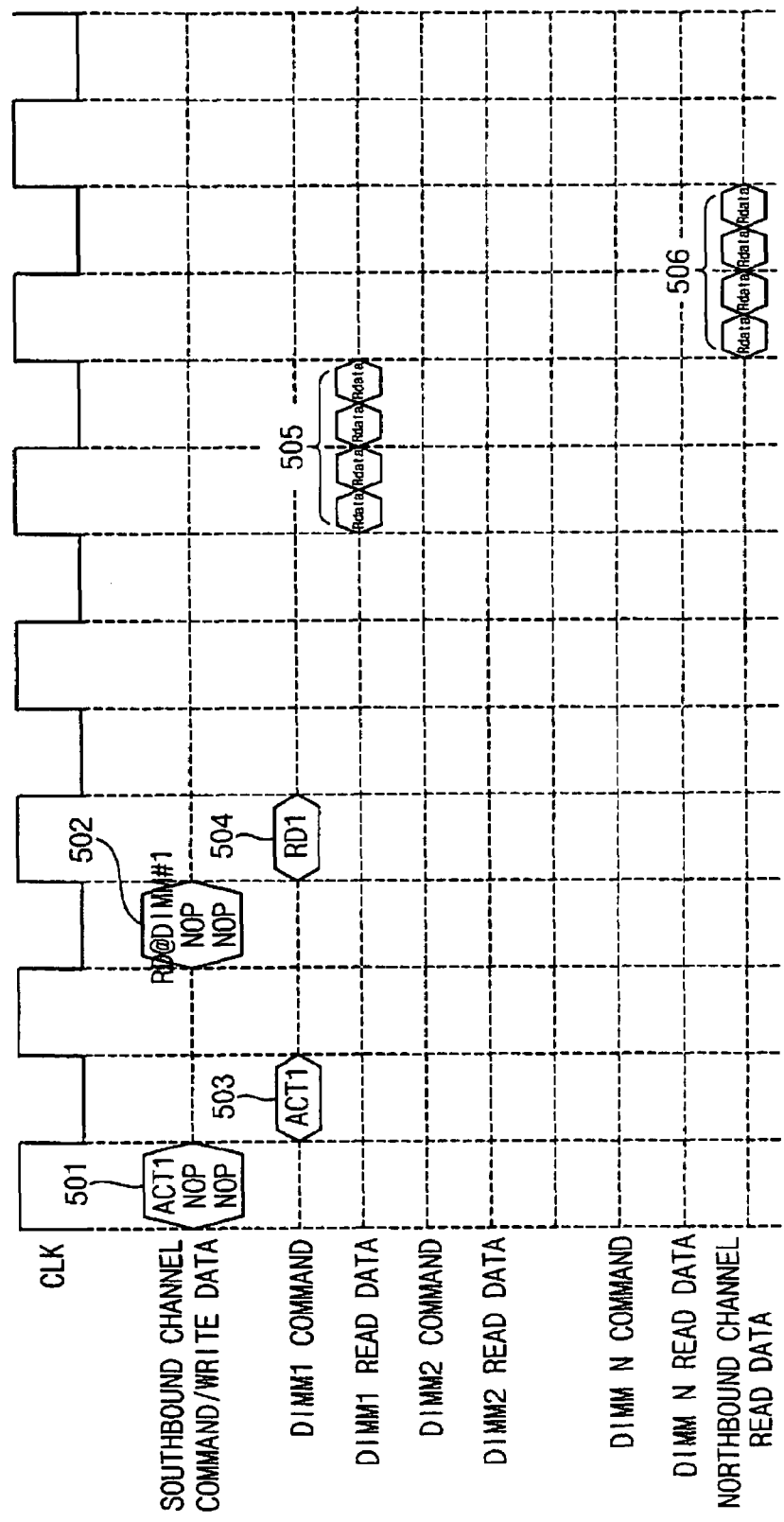
FIG. 5A is a timing diagram illustrating a read operation of a conventional FB-DIMM memory system.

FIG. 5A is a timing diagram illustrating a read operation of a conventional FB-DIMM memory system.

Figure 5B:
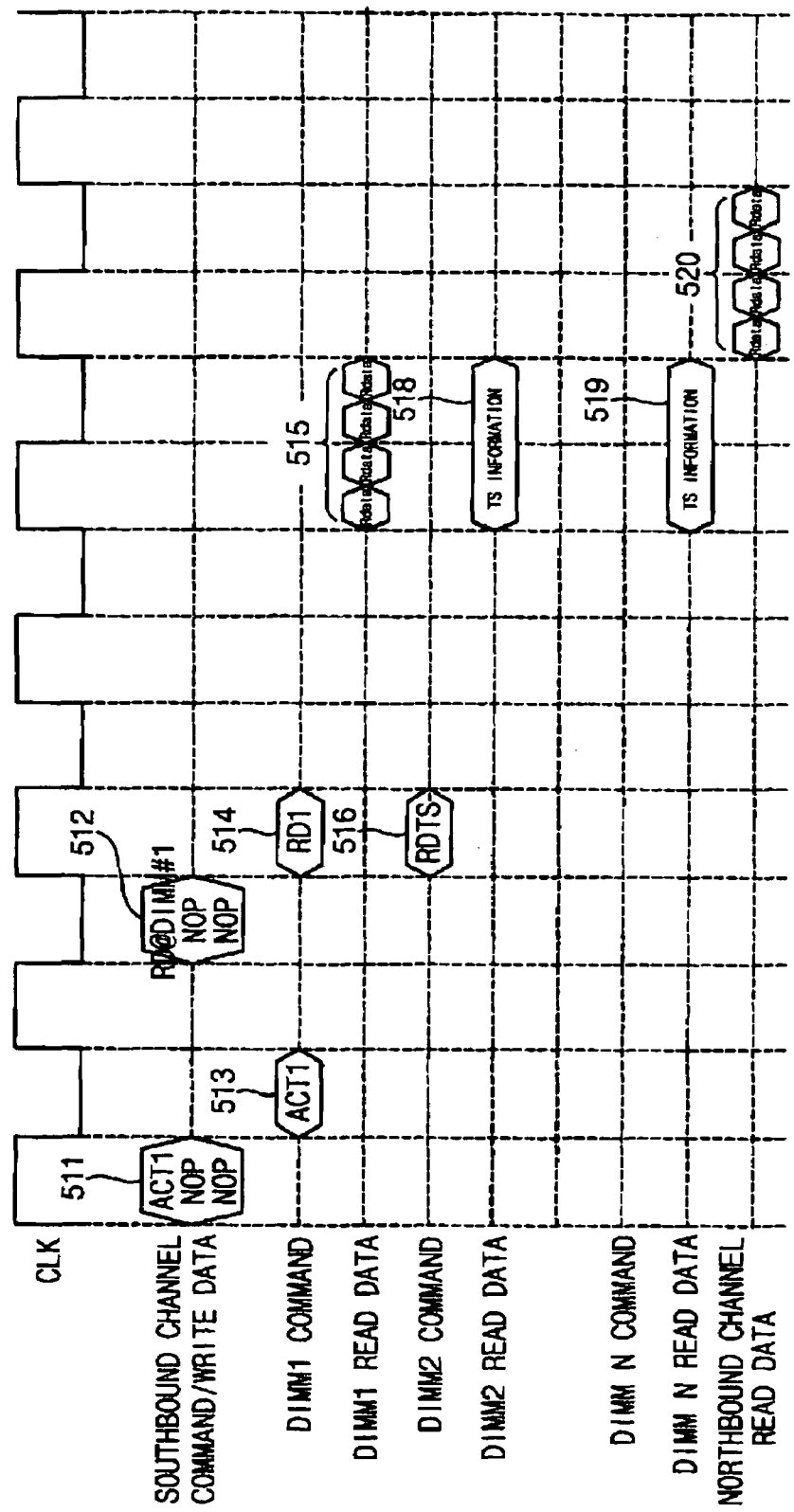
FIG. 5B is a timing diagram illustrating a read operation of an FB-DIMM memory system according to an example embodiment of the present invention.

FIG. 5B is a timing diagram illustrating a read operation of a FB-DIMM memory system according to an example embodiment of the present invention.

Referring to FIG 5A, the timing diagram may illustrate a read operation of the conventional FB-DIMM memory system illustrated in FIG. 1.

Referring to FIG. 1 and FIG. 5A, SB packets 501 and 502 transmitted from a host 110 may be transferred to a first FB-DIMM MM I through the last FB-DIMM MMn, via an SB packet receiver (SRx) and an SB packet transmitter (STx) of each memory hub (120-1, . . . , 120-n) connected with the host 110 by the daisy chain connection, during a single memory clock period (CLK).

Transferred SB packets 501 and 502 may be decoded in each memory hub control block 122 of each of the memory hubs (120-1, . . . , 120-n) included in each of the FB-DIMMs (MM1, . . . , MMn), and then destination information DST included in the command information may be analyzed. If the destination information DST of the transferred SB packets 501 and 502 is the same as a module identification code of the FB-DIMM, then the FB-DIMM may carry out the command operation designated in the transferred SB packet 501 and 502. If the destination information (DST) of the transferred SB packets 501 and 502 is not the same as the module identification code of the FB-DIMM, then the FB-DIMM may ignore the transferred SB packet 501 and 502. That is, only the FB-DIMM having the destination information (DST) included in the command information of the SB packet 501 and 502 may be selected. FIG. 5A shows that the destination information (DST) in the command information of the SB packets 501 and 502 may designate the first FB-DIMM (MM1), and an ACTIVATE command (ACT1) 503, and a READ command (RD1) 504 are sequentially input from the host 210.

Accordingly, the memory hub 120-1 of the designated FB-DIMM (MM1) may read data according to a read operation 505 from DRAM devices included in the designated FB-DIMM (MM1) and output the read data from the DRAM interface block 124 in response to the ACTIVATE command (ACT1) 503 and READ command (RD1) 504.

On the other hand, the SB packet receiver (SRx) of a nondesignated FB-DIMM (MM2) and the SB packet receiver (SRx) of a nondesignated FB-DIMM (MMn) may also receive the SB packets 501 and 502 and decode the received SB packets 501 and 502. However, because the destination information (DST) included in the command information may not be the same as the module identification code, the nondesignated FB-DIMMs (MM1, . . . , MMn) ignore the decoded command and maintain a non-operation mode.

Subsequently, the memory hub 120-1 of the designated FB-DIMM (MM1) may encode the data that may be read from DRAM devices (M1, . . . , Mm), through a read operation 505, into NB packets and transmits the NB packets through a transmission operation 506 to the host 110.

Referring to FIG. 5B and FIGS. 2 and 4, the timing diagram illustrates a read operation of an FB-DIMM memory system according to an example embodiment of the present invention.

Referring to FIG 5B, as noted above, SB packets (511, 512) transmitted by a host 210 may be transferred to each of FB-DIMMs (MM1, . . . , MMn) connected with the host 210 by a daisy chain connection.

The transferred SB packets (511, 512) may be decoded in memory hubs (220-1, . . . , 220-n) included in each of the FB-DIMMs (MM1, . . . , MMn) and destination information (DST) included in command information may be analyzed. In this example, only an FB-DIMM (MM1) having a module identification code that matches the destination information (DST) may perform a designated command operation.

On other hand, an SB packet receiver (SRx) of a memory hub 220-2 of an FB-DIMM (MM2) through an SB packet receiver (SRx) of the memory hub 220-n of the FB-DIMM (MMn) may receive the SB packets and decode the SB packet. However, because the destination information (DST) does not match the module identification code, the other FB-DIMMs (MM2, . . . , MMn) may ignore the decode command.

However, the memory hub control blocks 226 of the memory hub 220-2 of the FB-DIMM (MM2) through of the memory hub 220-n of the FB-DIMM (MMn) may read temperature information of their respective DRAM devices 230.

For example, the memory hub control block 226 of the memory hub 220-2 may transmit a temperature information request command 516 to the DRAM devices 230 through the memory interface block 221. The DRAM devices 230 that receive the temperature information request command 516 may transmit the temperature information 518, which may be measured by a temperature sensor embedded in each of the DRAM devices 230 to the memory hub control block 226 via the memory interface block 221. Operations of the memory hub control block 226 in the memory hubs 220-3 to of the other FB-DIMMs (MM3 to MMn) may operate the same as the FB-DIMM (MM2) as discussed above. FIG. 5B illustrates the memory hub control block 226 of the memory hub 220-n performing the same operation.

Also, the memory hub 220-1 of the designated FB-DIMM (MM1) may encode the data 515, which may be read from the DRAM devices (M1, . . . , Mm) in response to a read operation 514, into NB packets and transmits the NB packets to the host 210 (520).

On the other hand, as shown in FIG 5B the memory hub control block 226 of the memory hub 220-2 of the FB-DIMM (MM2) and the memory hub control block 226 of the memory hub 220-n of the FB-DIMM (MMn) may store the temperature information of the DRAM devices 230 into temperature information registers 225 of the memory hub 220-2 and 220-n instead of transferring the temperature information as the NB packet. As previously described, the host 210 may periodically read the temperature information of the DRAM devices 230 stored in the temperature information register 225. And, this information may be transferred via the respective SMBus interface block 223 via the SMBus.

As described above, FIG 5B illustrates the temperature information of the DRAM devices may be adjusted when the DRAM command (CMD) of the SB packet represents the READ command. However, the temperature information of the DRAM devices may be adjusted not only when the DRAM command (CMD) of the SB packet represents the READ command (RD1), but also when the DRAM command (CMD) represents a WRITE command.

While example embodiments of the present invention and their aspects have been described in detail, it should be understood that various changes, substitutions and alterations may be made herein without departing from the scope of the invention.

What is claimed is:

1. A memory hub, comprising:
   a memory hub control block configured to decode a command packet received from a host and determine whether the command packet has designated the memory hub, and if the command packet does not designate the memory hub control block for the operation, the memory hub control block configured to transmit a temperature information request to at least one of a plurality of semiconductor memory devices coupled to the memory hub, and configured to receive a temperature information from the at least one of the plurality of semiconductor memory devices.

2. The memory hub of claim 1, further including:
   a memory interface block configured to interface between the memory hub control block and the plurality of semiconductor memory devices; and
   a high-speed interface block configured to receive the command packet from the host and transmit a data packet to the host; and
   a bus interface block configured to interface the temperature information between the memory hub control block and the host.

3. The memory hub of claim 2, further including a memory hub registered block having a temperature information register configured to store the temperature information.

4. The memory hub of claim 2, wherein the high speed interface block includes a packet receiver configured to receive the command packet, and a packet transceiver configured to transmit the data packet.

5. The memory hub of claim 1, further including a memory hub registered block having a temperature information register configured to store the temperature information.

6. The memory hub of claim 5, wherein the temperature information is a flag indicating whether a temperature of at least one of the semiconductor memory device exceeds a threshold temperature.

7. The memory hub of claim 6, wherein the temperature information is a temperature value.

8. A fully-buffered memory module, comprising:
a plurality of semiconductor memory devices, each respectively configured with a temperature sensor embedded therein; and
a memory hub configured to buffer a command packet received from a host, control the plurality of semiconductor memory device in response to the command packet, buffer an output signal received from the plurality of semiconductor memory devices, and transmit the buffered output signal to the host,
wherein the memory hub is configured to generate a temperature information request signal if the command packet received from the host does not designate the memory hub.

9. The fully-buffered memory module of claim 8, wherein the memory hub comprises:
a memory hub control block configured to decode a command packet received from a host and determine whether the command packet has designated the memory hub, and if the command packet does not designate the memory hub control block for the operation, the memory hub control block configured to transmit a temperature information request to at least one of a plurality of semiconductor memory devices coupled to the memory hub, and configured to receive a temperature information from the at least one of the plurality of semiconductor memory devices.

10. The fully-buffered memory module of claim 9, further including:
a memory interface block configured to interface between the memory hub control block and the plurality of semiconductor memory devices; and
a high-speed interface block configured to receive the command packet from the host and transmit a data packet to the host;
a bus interface block configured to interface the temperature information between the memory hub control block and the host; and
a memory hub registered block having a temperature information register configured to store the temperature information.

11. The fully-buffered memory module of claim 8, wherein the semiconductor memory devices include at least one temperature information output pin to output the temperature information.

12. The fully-buffered memory module of claim 11, wherein the at least one temperature information output pin includes a pin that is activated to output the temperature information, if a measured temperature is above a threshold temperature.

13. The fully-buffered memory module of claim 8, wherein the temperature information is transmitted to the host via a bus.

14. The fully-buffered memory module of claim 13, wherein the bus does not carry the command packet.

15. A fully-buffered memory module system, comprising:
at least one memory module; and
a host configured to connect to the at least one memory module; wherein the at least one memory module includes,
a plurality of semiconductor memory devices, each respectively configured with a temperature sensor embedded therein; and
a memory hub configured to buffer a command packet received from a host, control the plurality of semiconductor memory device in response to the command packet, buffer an output signal received from the plurality of semiconductor memory devices, and transmit the buffered output signal to the host,
wherein the memory hub is configured to generate a temperature information request signal if the command packet received from the host does not designate the memory hub.

16. The fully-buffered memory module system of claim 15, wherein the memory hub includes:
a memory hub control block configured to decode a command packet received from a host and determine whether the command packet has designated the memory hub, and if the command packet does not designate the memory hub control block for the operation, the memory hub control block configured to transmit a temperature information request to at least one of a plurality of semiconductor memory devices coupled to the memory hub, and configured to receive a temperature information from the at least one of the plurality of semiconductor memory devices.

17. The fully-buffered memory module system of claim 16, wherein the memory hub includes:
a memory interface block configured to interface between the memory hub control block and the plurality of semiconductor memory devices; and
a high-speed interface block configured to receive the command packet from the host and transmit a data packet to the host;
a bus interface block configured to interface the temperature information between the memory hub control block and the host; and
a memory hub registered block having a temperature information register configured to store the temperature information.

18. The fully-buffered memory module system of claim 15, wherein the host is configured to adjust an operation speed of the semiconductor memory devices of the memory module based on the received temperature.

19. The fully-buffered memory module of claim 17, wherein the host is configured to periodically read the temperature of the semiconductor memory devices stored in the temperature information register in the memory hub.

20. A method of monitoring dynamic temperature of a semiconductor memory device, comprising:
receiving a command packet at a memory hub;
determining whether the command packet designates the memory;
transmitting a temperature information request signal to at least one semiconductor memory device if the command packet does not designate the memory hub; and
receiving temperature information from the at least one semiconductor memory device.

21. The method of claim 20, further comprising:
saving the received temperature information.

22. The method of claim 20, wherein the command packet is transmitted by a host.

23. The method of claim 20, wherein the transmitting step transmits the temperature information request signal to at least one of the plurality of semiconductor memory devices.

24. The method of claim 23, further comprising:
periodically reading the received temperature information by a host.

25. The method of claim 23, further comprising:
adjusting, by a host, an operation speed of the at least one of the plurality of semiconductor memory devices based on the received temperature information.

* * * * *